(12) United States Patent
Migdall et al.

(10) Patent No.: US 8,543,356 B2
(45) Date of Patent: Sep. 24, 2013

(54) LOW COST MULTI-CHANNEL DATA ACQUISITION SYSTEM

(75) Inventors: Alan Lee Migdall, Gaithersburg, MD (US); Serery Polykov, Germantown, MD (US); Sae Woo Nam, Boulder, CO (US)

(73) Assignee: National Institute of Standards and Technology, Gaithersberg, MD (US)

( * ) Notice: Subject to any disclaimer, the term of this patent is extended or adjusted under 35 U.S.C. 154(b) by 468 days.

(21) Appl. No.: 12/354,516

(22) Filed: Jan. 15, 2009

(65) Prior Publication Data

US 2011/0178774 A1    Jul. 21, 2011

Related U.S. Application Data

(60) Provisional application No. 61/023,282, filed on Jan. 24, 2008.

(51) Int. Cl.
*G06F 17/40* (2006.01)
*H03K 19/21* (2006.01)

(52) U.S. Cl.
CPC .................................. *H03K 19/21* (2013.01)
USPC ........................................... 702/187; 702/73

(58) Field of Classification Search
USPC .................................... 702/73, 187
See application file for complete search history.

(56) References Cited

U.S. PATENT DOCUMENTS

| | | | | |
|---|---|---|---|---|
| 3,777,133 A | * | 12/1973 | Beck et al. | 708/425 |
| 3,955,088 A | * | 5/1976 | Muehllehner et al. | 250/363.03 |
| 3,971,921 A | * | 7/1976 | Schmit et al. | 702/73 |
| 3,992,672 A | * | 11/1976 | Fasching | 327/27 |
| 4,070,578 A | * | 1/1978 | Timothy et al. | 250/336.1 |
| 4,181,855 A | | 1/1980 | Horrocks | |
| 4,395,635 A | | 7/1983 | Friauf et al. | |
| 4,418,282 A | * | 11/1983 | Horrocks | 250/366 |
| 4,580,056 A | | 4/1986 | Kaiser et al. | |
| 4,651,006 A | * | 3/1987 | Valenta | 250/362 |
| 4,931,646 A | * | 6/1990 | Koechner et al. | 250/367 |
| 5,172,091 A | * | 12/1992 | Arnold et al. | 340/146.2 |
| 5,528,516 A | * | 6/1996 | Yemini et al. | 702/181 |
| 6,160,259 A | | 12/2000 | Petrillo et al. | |
| 6,232,604 B1 | * | 5/2001 | McDaniel et al. | 250/363.03 |
| 6,333,958 B1 | | 12/2001 | Stewart et al. | |
| 6,362,478 B1 | * | 3/2002 | McDaniel et al. | 250/361 R |
| 6,437,597 B1 | * | 8/2002 | Chan | 326/16 |
| 6,804,631 B2 | * | 10/2004 | Kelley et al. | 702/187 |
| 6,912,485 B2 | * | 6/2005 | Lightfoot et al. | 702/188 |
| 7,057,172 B2 | * | 6/2006 | Goldie | 250/336.2 |
| 7,154,947 B2 | | 12/2006 | Kawamata | |
| 7,521,682 B1 | * | 4/2009 | Holland et al. | 250/370.01 |
| 8,041,996 B2 | * | 10/2011 | Rathunde et al. | 714/26 |
| 2003/0062482 A1 | * | 4/2003 | Williams et al. | 250/363.03 |
| 2004/0017224 A1 | * | 1/2004 | Tumer et al. | 327/51 |

(Continued)

*Primary Examiner* — Sujoy Kundu
*Assistant Examiner* — Timothy H Hwang
(74) *Attorney, Agent, or Firm* — Jill Welytok

(57) ABSTRACT

Embodiments of the present invention provide an inexpensive and fast pulse characterization platform capable of real time operation, suitable for acquisition of single-photon data. Embodiments of the present invention include both a digital multi-channel data acquisition instrument and an analog pulse acquisition instrument suitable for a wide range of applications in physics laboratories. An FPGA performs multi-channel acquisition in real time, time stamps single events, and determines if the events fit a predetermined signature, which causes the events to be categorized as a coincidence. The indications of coincidences are then communicated to a host computer for further processing as desired.

17 Claims, 5 Drawing Sheets

(56) References Cited

U.S. PATENT DOCUMENTS

| | | | |
|---|---|---|---|
| 2007/0023669 A1* | 2/2007 | Hefetz et al. | 250/370.14 |
| 2007/0288933 A1* | 12/2007 | Shariff et al. | 719/318 |
| 2008/0052621 A1* | 2/2008 | Oliverio et al. | 715/700 |
| 2008/0192881 A1* | 8/2008 | Newell et al. | 377/54 |
| 2009/0150311 A1* | 6/2009 | George | 706/12 |
| 2009/0164439 A1* | 6/2009 | Nevins | 707/3 |
| 2009/0224158 A1* | 9/2009 | Haselman et al. | 250/363.02 |
| 2009/0302232 A1* | 12/2009 | Grosholz et al. | 250/394 |

* cited by examiner

LOW COST MULTI-CHANNEL DATA ACQUISITION SYSTEM

CLAIM OF PRIORITY

This application claims priority to U.S. Provisional Patent Application No. 61/023,282 filed Jan. 24, 2008.

STATEMENT REGARDING FEDERALLY SPONSORED RESEARCH OR DEVELOPMENT

The invention described herein was made by employees of the United States government and may be manufactured and used by or for the government for government purposes without the payment of any royalties thereon or therefore.

FIELD OF THE INVENTION

The present invention relates generally to the field of data acquisition, and more specifically to coincidence detection systems.

BACKGROUND

Coincidence detection is used either to detect individual coincidence events as they occur or to count them for the purpose of providing summary data after some interval of time. Coincidence circuits are widely used in particle physics experiments and in other areas of science and technology. Coincidence circuits were the subject of the Nobel Prize for Physics in 1954, and are also disclosed in U.S. Pat. No. 7,057,172, to Goldie, which is incorporated in its entirety herein by reference.

Classically, coincidence detection is realized using either analog or digital electronic techniques. In the analog realization, the time between an event in one channel and an event in a second channel is recorded and those times within a certain range are designated "coincidence events." In a digital realization, use is made of the "and" function, which is well known in digital electronics. A coincidence occurs when a signal pulse on one input AND a second signal pulse on another input happen together. This requires setting time delays to assure that signal from coincident event arrive at the AND function circuit at the same time making a practical coincidence detection somewhat more complex.

Multi-coincidences (coincidences between more than two events) are of interest in scientific and diagnostic equipment troubleshooting, intelligence gathering, environmental forecasting and other contexts. Real-world designs must implement a specified time window in which coincidences would be counted, and must allow for arbitrary but fixed delays between channels.

Real world systems must also take into account other problems that may arise from the varying size and shape of the signal pulses. When coincidence detection between more than two channels is required, the complexity of these two channel-based solutions increases greatly, often making their application unfeasible.

It is thus desirable to have a simplified, reliable coincidence detection system which can be used to detect multi-coincidences and which provides for equivalent (symmetrical) treatment of channel inputs having varying size and shape of the signal pulses.

It is further desirable to have a system which eliminates common problems for asynchronous time-to-amplitude converters and which has external clock synchronization capability.

It is further desirable to have a system capable of high data-transfer rates that ensure that detection rates are not limited by data-transfer rates (e.g, detection rates up to two hundred million events per second).

It is further desirable to have a simplified system design which may be adapted for use with computer peripherals (e.g., keyboards, mice, memory sticks, etc.).

SUMMARY OF THE INVENTION

The present invention is an easily configurable multi-channel data acquisition system which monitors the multi-coincidence of "signature events" using digital electronic techniques inherently scalable to many channels to identify the multi-coincidence of signature events. The system determines if the signature meets some criterion or criteria and only then issues the notification of the event.

The present invention may be used in a wide range of scientific applications and settings. Examples of embodiments of the present invention include identification of the signature of a heart pumping problem (such as a system to identify a murmur), the signature of a brain seizure, the signature of an engine that may or may not be malfunctioning (e.g., a missing cylinder, bad valve, shuddering motor), signature of a plumbing or heating or ventilation system that may have a malfunction or leak (drip sound, vibration caused by bad fan or compressor, missing bolt, broken damper), signature of electrical static or shorting in cables or electronic device or motor, radar pattern of incoming objects (e.g., distinguishing birds, planes, missiles, cloud type, tornadoes), motion signature (e.g., rabbit, human, car, wind), dust or other particle analysis including in vitro or in vivo (e.g, determining what type of biological particle, or radioactive particle, or molecule, or pollution is in the air, or colloidal particles in liquid, like blood cell rates and/or types that might be illuminated by an optical or acoustical source, structural integrity determined by acoustic vibration monitoring (e.g., bridges, buildings, dams), any intelligent geological movement monitoring (e.g., earthquake, tsunami, landslide). All of these monitoring uses are done in an intelligent manner where the monitoring is continuous and the system determines if the signature meets some criterion or criteria and only then issues the notification of the event. Not only can the present invention detect the fact of malfunctioning, but it can point to a probable cause or source of the malfunction, based on a signature specific to each particular problem.

The multi-channel data acquisition system disclosed herein provides an inexpensive and fast pulse characterization platform capable of real time operation, suitable for acquisition of single-photon data. Embodiments of the present invention may include both a digital multi-channel data acquisition instrument and an analog pulse acquisition instrument suitable for a wide range of applications in physics laboratories.

The system includes a user configurable processor that is capable of running autonomously after configuration, such as a Field Programmable Gate Array (FPGA). The user configurable processor performs multi-channel acquisition in real time using analog realization (e.g., timestamps of single events from individual channels) or digital realization (e.g., a signal pulse on one input AND a second signal pulse on another input happen together). The user configurable processor then determines if the events fit a predetermined signature, which causes the events to be categorized as a coincidence. The indications of coincidences may then be communicated to a host processor for further processing and/ or evaluation. The host processor may be any computer or machine which manipulates and interprets data pursuant to a set of instructions (e.g., a, personal digital assistant or wireless communicator).

The user configurable processor may further include a plurality of acquisition channels, each channel configured and disposed to detect a single event or sequence of events from a detector or other pulsed source, a means for determining if a coincidence has occurred, an optional means for generating a timestamp for each single event, and a means for communicating the occurrence of the coincidence to the host processor. The host processor receives data from a user configurable processor (e.g., an FPGA).

Examples of signature events that the multi-channel data acquisition system disclosed herein may process to determine a multi-coincidence include but are not limited to monitoring a level threshold, crossing of an integrated area threshold, matching the waveform shape (including single or multi-peaked shapes), finding a local maximum, finding a pulse exceeding a certain duration, etc. For the purposes of this disclosure, a coincidence is the occurrence of a plurality of single signature events, detected within a predetermined time interval that matches a predefined pattern.

Various embodiments of the multi-channel data acquisition system disclosed herein will further include a communications bus (e.g., a USB 2.0). The communications bus is configured and disposed to allow data communication between the host processor and the user configurable processor. Other embodiments may include a communication controller device which may perform low level communications, such as buffering of data. Alternatively, the user configurable processor (e.g. FPGA) may perform the low level communications processing internally.

Other embodiments of the multi-channel data acquisition system will further include at least one detector (sensor) which is configured and disposed to provide input to one of the plurality of acquisition channels (e.g. four acquisition channels) upon detection of a single event. A detector may be a single-photon avalanche photodiode (SPAD). The output of the SPAD is then fed to a conditioning circuit, which converts the signal to suitable voltage levels for input into the acquisition channels on board the FPGA. If the voltage level of a SPAD output pulse is compatible with the 1.4-1.5V to 1 threshold of the FPGA, no conditioning circuit is needed.

In another embodiment of the present invention, the FPGA threshold voltage is user-specified and can be arbitrarily set and hence matched with the SPAD output levels and may, for example, be set with either an either an external ADC or an external comparator Another embodiment of the multi-channel data acquisition system will further include digital realization wherein the "and" function, well known in digital electronics, will be used to determine a multi-coincidence. For example, digital realization can be used to determine a multi-coincidence wherein a first coincidence occurs when a signal pulse on one input AND a second signal pulse on another input happen together. This possibility requires setting time delays to assure that the signal pulses from the coincident events arrive at the AND function circuit at the same time-making practical coincidence detection somewhat more complex.

In another exemplary embodiment an internal or external periodic process is used to generate clock pulses that are used to time-stamp single events. In these exemplary embodiments, events are matched to a pre-determined sequence pattern to determine if a coincidence (i.e. a match with one or more pre-determined patterns has occurred).

In other embodiments, the multi-channel data acquisition system may include an analog-to-digital converter (ADC) for the purposes of interfacing with analog sensors, namely to digitize the output of an analog sensor. Some analog sensors may be photon-number resolving. To accommodate multiple photon detection in the analog domain, without the necessity of storing the entire waveform, a variety of processing techniques may be applied to the analog waveform. These techniques include, but are not limited to filtering by frequency manipulation (e.g. band pass filtering), recording when the waveform exceeds a predetermined threshold, recording peak amplitude, recording the result of pulse shape fitting, such as nonlinear least square fit wherein the fitting parameter exceeds a predetermined threshold, and recording pulse duration and/or integral, wherein these pulse parameters are based on crossing a predetermined threshold. Any combination of these tests can be used simultaneously on different input channels and/or a combination of these tests can be performed on a single input, ultimately contributing toward a multiple coincidence.

In another embodiment of the present invention, a start channel in the FPGA, triggers a measurement cycle. There are various possible configurations and embodiments for initiating a measurement cycle. For example, a host processor may provide an input to the start channel to initiate a measurement. In another embodiment, an external signal, such as the start signal from a laser used to excite a sample under test, may be used as the input to the start channel. In yet another embodiment, the measurement is initiated internally, via a rollover counter on board the FPGA. When the counter rolls over a new measurement is started. In yet another embodiment of the present invention the value of the counter is established by the user via the host processor, and communicated to the FPGA via the communications bus.

In another embodiment of the present invention, an FPGA can derive time stamps relative to an internal or any external periodic signal. An external signal could be an electronic pulse, as might be generated by a trigger circuit of a process that is being observed, such as, for example, a trigger pulse generated from a pulsed laser.

Embodiments of the present invention provide performance comparable to much more elaborate commercial instruments for a fraction of the cost. Embodiments of the present invention also provide for simple assembly and installation. These advantages, and others, will be made apparent from the detailed description that follows.

Glossary

As used herein, the term "analog sensor array" means a sensor or collection of analog sensors (detectors), each capable of providing an analog output waveform from which the detection of an event or events can be derived. This can happen independently of other sensors within the array if this is an array rather than a single sensor.

As used herein, the term "analog filter" means any filter which operates on continuous-time signals.

As used herein, the term "analog-to-digital converter (ADC)" means a device which converts continuous signals to discrete digital numbers.

As used herein, the term "bandpass filtering" means an electronic device or circuit that allows signals between two specific frequencies to pass, but that discriminates against signals at other frequencies.

As used herein, the term "communications bus" means an electronic device (e.g., a USB 2.0) or circuit to permit data communication between a host computer or processor and an acquisition board.

As used herein the term "coincidence" or "multi-coincidence" means that a plurality of events having one or more specified signatures occur. For example, with respect to analog realization, an event in one channel and an event in a second channel are simultaneous, within a certain range, or separated by a certain time interval or intervals are designated "coincidence events." In a digital realization, coincidence means when a signal pulse on one input AND a second signal pulse on another input happen together, within a certain time range, or separated by a certain time interval.

As used herein, the term "coincidence circuits" means an electronic device with one output and two (or more) inputs.

As used herein, the term "communications bus" is a mechanism and/or protocol standard to interface devices to a host computer means a device (e.g., a USB 2.0).

As used herein, the term "communication controller" means a device which handles transmitting and receiving data via a communications bus to the host processor or computer.

As used herein, the term "data reduction module" means a device or circuit used to perform additional processing of coincidences prior to sending the data to the host processor.

As used herein, the term "digital sensor array" means a collection of digital sensors (detectors), each sensor capable of providing a logical pulse upon detecting an event, independently of other sensors within the array.

As used herein, the term "exciter" means a device used to excite a physical system.

As used herein, the term "external clock source" a digital clock external to the acquisition circuit.

As used herein, the term "Field Programmable Gate Array (FPGA)" means a configurable processor that is capable of being configured by a user.

As used herein, the term "host processor" means a host computer, personal digital assistant, wireless communicator or other interface device that collects and/or acts according to information collected.

As used herein, the term "measurement cycle" means a cycle of measurement that is initiated by an an external signal heralding the beginning of the measurement.

As used herein, the term "parameter memory" means the memory in the configurable processor configured to be writable via the host processor.

As used herein, the term "plurality" means more than one.

As used herein, the term "predetermined integral area" means the area under a pulse curve between two crossings of a threshold level.

As used herein, the term "pulse signals" also known as "signal pulses" means output of an analog or digital sensor.

As used herein, the term "sensor" or "detector" means a device that receives a signal and responds to it in a distinctive manner.

As used herein, the term "shape" means a pre-defined waveform contour that represents a particular process so that the input waveform can be continuously matched against this contour to determine if the process in question has occurred.

As used herein, the term "signature event" or "event" means an event detected by a sensor, which includes but is not limited to monitoring a level threshold, crossing of an integrated area threshold, matching the waveform shape (including single or multi-peaked shapes), finding a local maximum, finding a pulse exceeding a certain duration, etc. For the purposes of this disclosure, a coincidence is the occurrence of a plurality of signature events, detected within a predetermined time interval that matches a predefined pattern.

As used herein, the term "single-photon avalanche photodiode (SPAD)" means a class of solid-state photodetectors based on a reverse biased p-n junction in which a photo-generated carrier can trigger an avalanche current.

As used herein, the term "start channel" means a channel in a configurable processor used to start a measurement cycle.

As used herein, the term "time stamp" means the current time of an event measured by a computer.

As used herein, the term "trigger" means a pulse that starts a cycle

As used herein, the term "Universal Serial Bus (USB)" means a serial bus standard to interface devices to a host computer.

As used herein, the term "user configurable processor" means a processor that runs autonomously after configuration.

BRIEF DESCRIPTION OF THE DRAWINGS

The structure, operation, and advantages of the present invention will become further apparent upon consideration of the following description taken in conjunction with the accompanying figures. The figures are intended to be illustrative, not limiting.

Certain elements in some of the figures may be omitted, or illustrated not-to-scale, for illustrative clarity. Block diagrams may not illustrate certain connections that are not critical to the implementation or operation of the present invention, for illustrative clarity.

Figure 1:
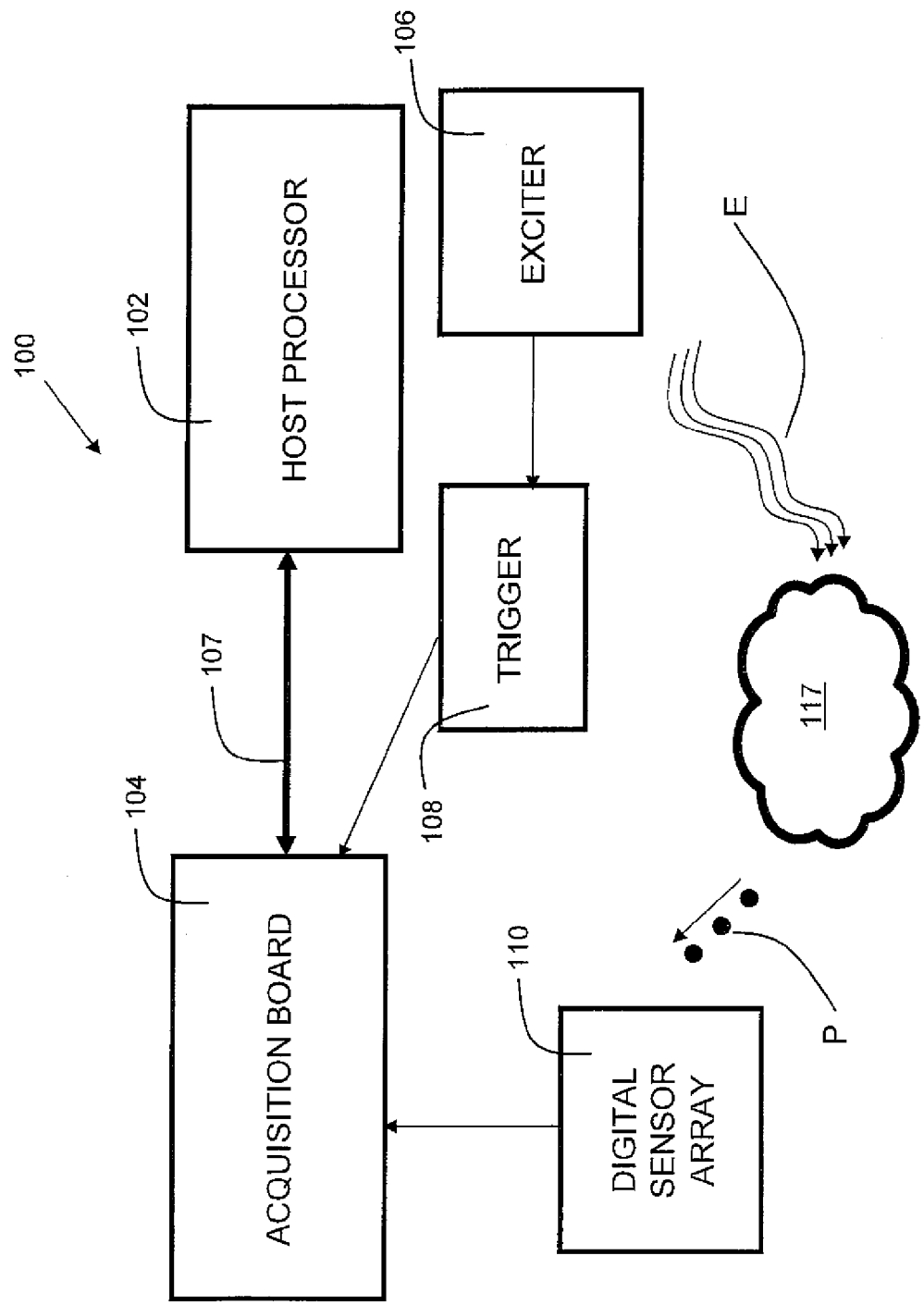

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 is a system block diagram of an embodiment of the present invention.

Figure 2:
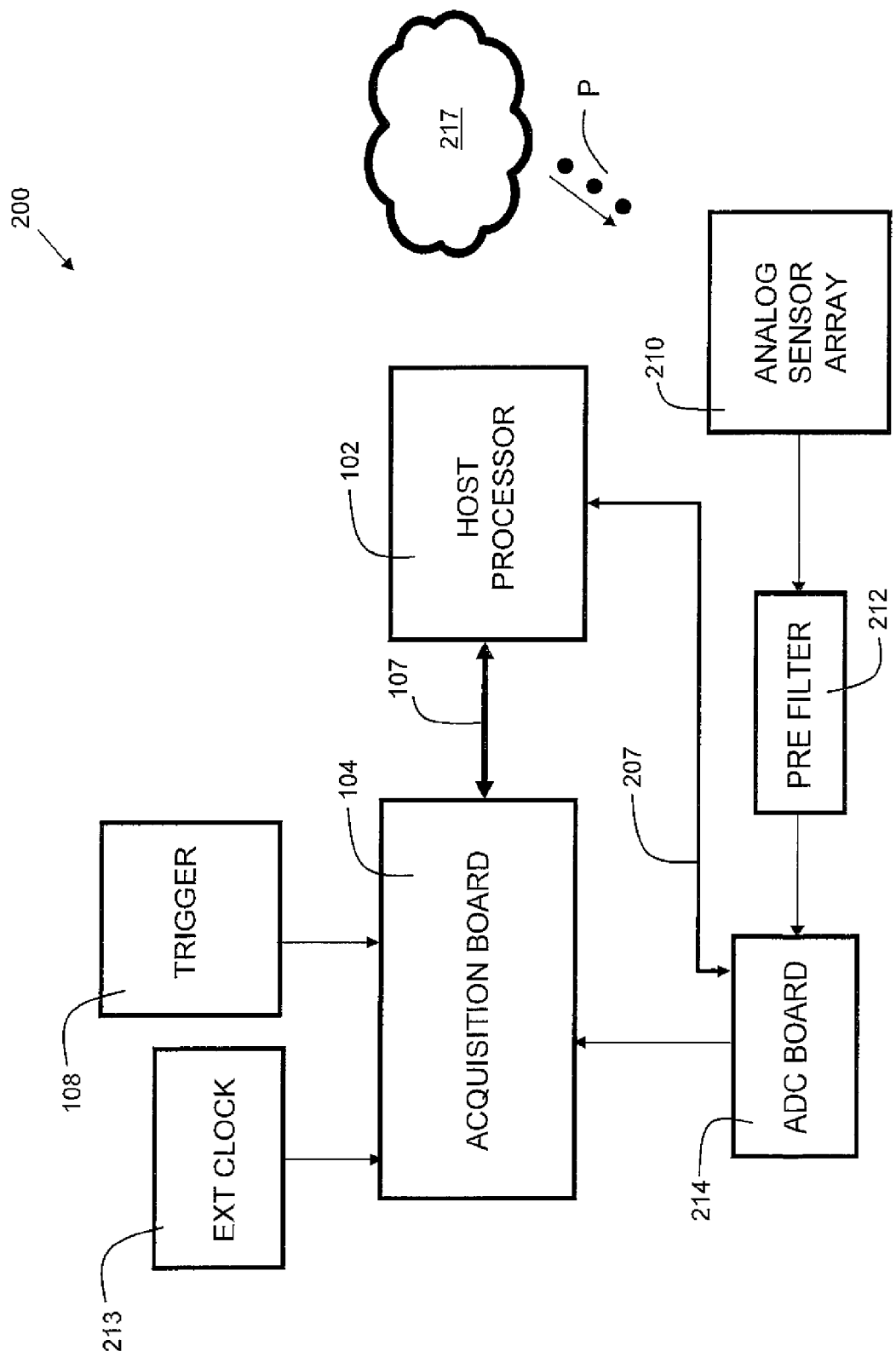

FIG. 2 is a system block diagram of an alternative embodiment of the present invention.

Figure 3:
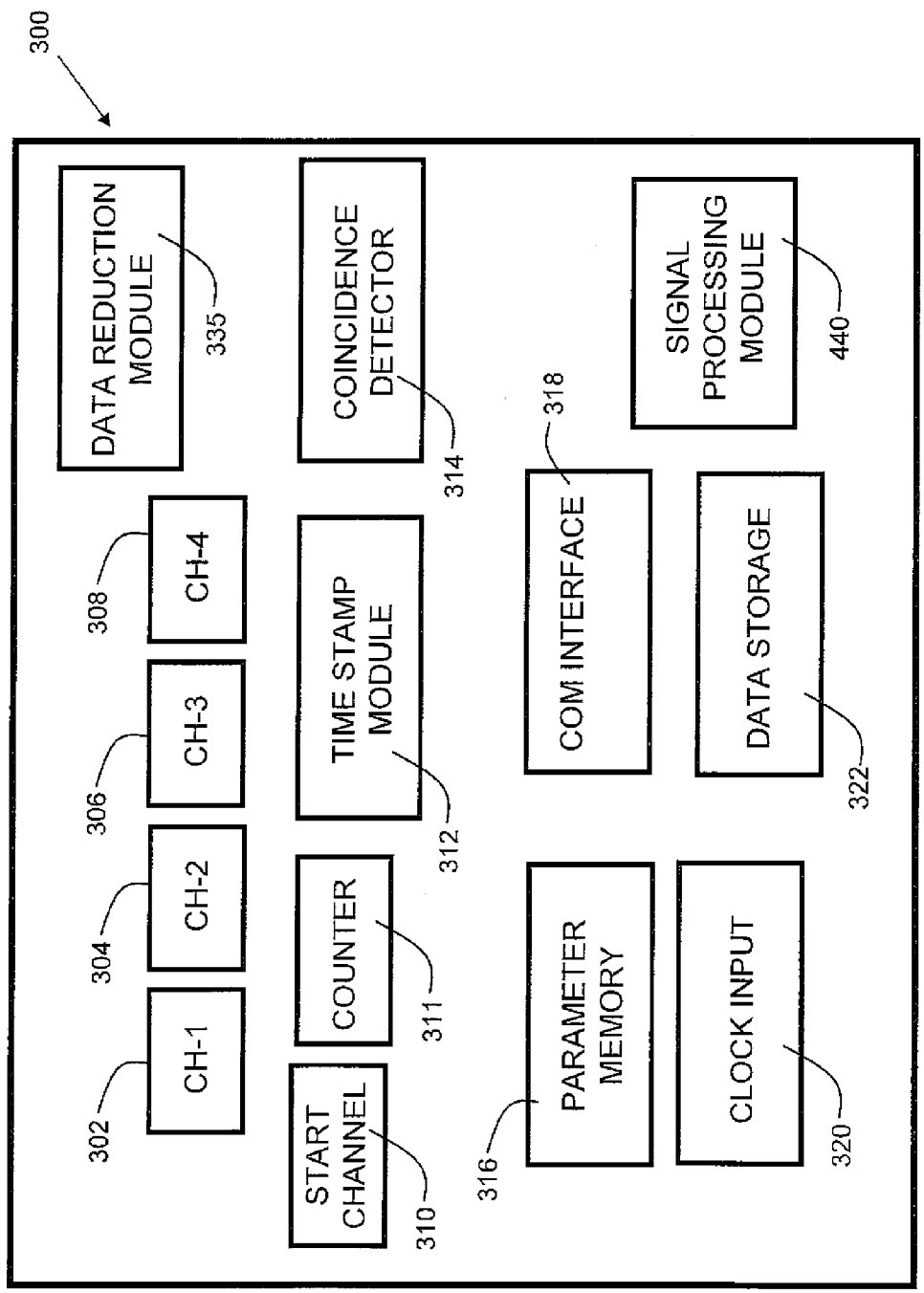

FIG. 3 is a block diagram of an FPGA configured in accordance with an embodiment of the present invention.

Figure 4:
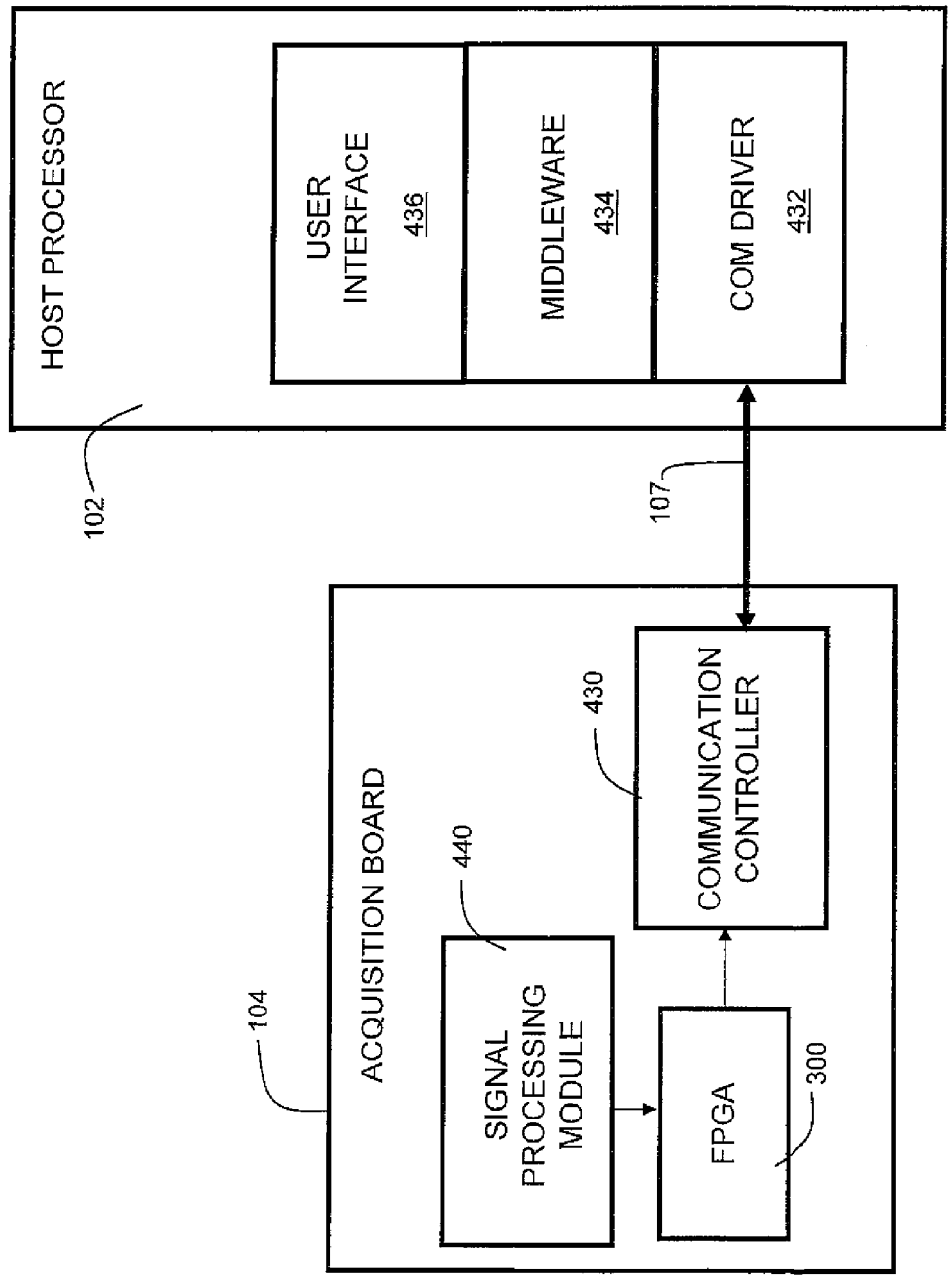

FIG. 4 is a block diagram illustrating details of the interface between the acquisition board and the host processor in accordance with an embodiment of the present invention.

Figure 5:
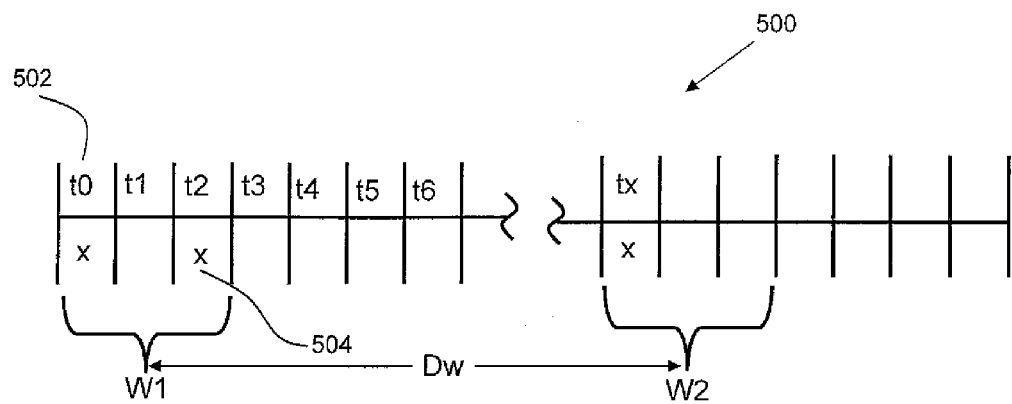

FIG. 5 is a timeline representing single events that comprise a coincidence.

Figure 6:
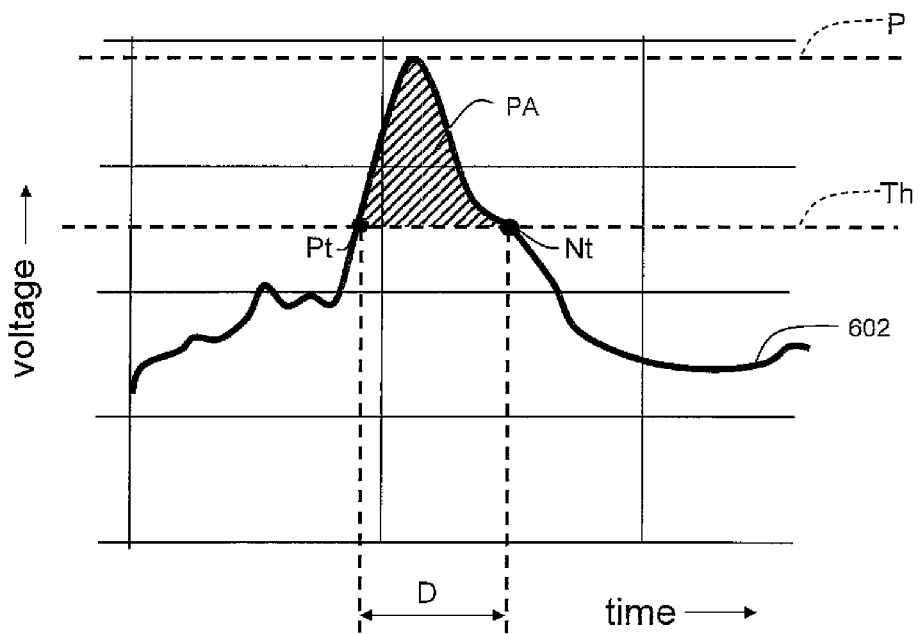

FIG. 6 illustrates processing performed on the output of an analog sensor.

DETAILED DESCRIPTION OF THE INVENTION

FIG. 1 is a block diagram of an exemplary multi-channel acquisition system 100 in accordance with an embodiment of the present invention. System 100 comprises host processor 102, which may be a PC running Windows, Linux, or other suitable operating system. Host processor 102 communicates with acquisition board 104 via communications bus 107. In one embodiment, communications bus 107 is a Universal Serial Bus (USB). However, other communication mechanisms are possible, such as Ethernet, RS-232, and IEEE-1394.

Acquisition board 104 comprises multiple input channels, such that each sensor from digital sensor array 110 is received at acquisition board 104 via a dedicated channel. In the exemplary embodiment shown, four input channels are used. Digital sensor array 110 is comprised of a plurality of digital sensors, wherein each sensor is connected to one of the inputs on the acquisition board 104. For example, in one embodiment, each digital sensor is comprised of a single-photon avalanche photodiode (SPAD). The outputs of the SPADs are then fed to acquisition board 104. Exciter 106, used to excite a physical system 117 with electromagnetic energy E, is typically a pulsed laser. The physical system 117 then emits photons P, which are detected as a plurality of single events, one after another, by the sensor array 110. Time bins are derived using either external clock 213 or trigger 108. In a latter case, exciter 106 also drives trigger 108, which is then fed to the acquisition board 104. In one embodiment, exciter 106 is a Ti-Sapphire pulsed laser. By triggering off of the activation of exciter 106, which drives the physical process under study, jitter is reduced, since the clock on the acquisition board 104 is synchronized to a reliable external clock source.

FIG. 2 is a block diagram of a multi-channel acquisition system 200 in accordance with a further exemplary embodiment of the present invention. In this embodiment, analog sensor array 210 is used in place of digital sensor array 110 (see FIG. 1), and detects photons emitted from the physical system, similar to as described in FIG. 1.

Some analog sensors are photon-number resolving, meaning that multiple simultaneous photons can be detected. The output of analog sensor array 210 is optionally fed to pre-filter 212, which performs filtering in the analog domain, prior to being input to ADC board 214. Pre-filter 212 is an analog filter that may perform bandpass filtering, low pass filtering, or high pass filtering, to match the bandwidth of the ADC board 214. Trigger 108 may optionally be used to synchronize an internal clock signal on the acquisition board 104. This greatly reduces jitter by synchronizing the clock on the acquisition board 104 to an clock source synchronized for analysis, measurement and/or experimentation of an external event.

Communications bus 207 allows the host processor 102 to configure the digital filter settings on the ADC board 214. The output of the ADC board 214 is a series of digital pulses that are issued continuously in a format compatible with the FPGA. An FPGA or other user configurable processor chip, applies a set of specified criteria, and if those criteria are met, then those pulses will be considered in calculating coincidences. The coincidences are then fed into host processor 102 via bus 107. For example, if it is specified that the signal output from the analog sensor array 210 must have a width of at least 10 nanoseconds, then all pulse signals having a width of less than 10 nanoseconds will be rejected, and no pulse signal will be considered for defining coincidences. For pulses of 10 nanoseconds or greater, the acquisition board 104 will generate an appropriate record to indicate a single event from the analog sensor 210. This approach allows the circuitry within acquisition board 104 to operate with analog sensors or digital sensors.

FIG. 3 is a block diagram of an FPGA 300 configured in accordance with an embodiment of the present invention. FPGA 300 is installed on acquisition board 104. In this embodiment, four acquisition channels, CH-1, CH-2, CH-3, CH-4, referred to with reference numbers 302, 304, 306, and 308, respectively, are present. However, it is possible to have more or less acquisition channels without departing from the scope and purpose of the present invention. An optional start channel 310 is used to start a measurement cycle, and may be activated via an external signal heralding the beginning of the measurement. Alternatively, the start channel 310 may be activated internally, by internal counter 311. The counter 311 may be initialized with a predetermined value and decremented at regular intervals. When the count value in counter 311 reaches zero, the start channel 310 is activated to start a measurement. A system with no start channel runs an infinite measurement cycle (ie. measures continuously).

Each event received from acquisition channels 302-308 is given a time stamp via time stamp module 312. The module 312 uses timing information from 311 to assign the time step. Counter 311 may be synchronized to an internally generated signal such as that of an internal oscillator (not shown). Alternatively, time stamp module may be synchronized to an externally generated signal, such as one fed to clock input 320.

In one embodiment, the time stamp resolution is 5 nanoseconds. Each 5 nanosecond time slice is referred to as a time bin. Trigger 108 can be used to derive an internal FPGA clock (via clock input 320) that then defines time bins (via counter 311) that are bound to a process. An event that happens during time 0 to 5 nanoseconds is in the first time bin, an event that happens during a time from 5 nanoseconds to 10 nanoseconds is in the second time bin, and so on. Coincidence detector 314 identifies each of the time bins that contain events. If the identified time bins match a predetermined pattern, or "signature," then the sequence of events is considered a "coincidence" and is reported to the host processor 102 (see FIG. 1) via communications interface 318, over communications bus 107 (see FIG. 1). Many prior art coincidence detection systems cannot handle simultaneous events, since they require that a fixed delay be added to one channel to guarantee that it arrives after an event in another channel. However, this embodiment of the present invention can detect coincidences even when events arrive in an arbitrary order, such as a series of sequential events, simultaneous events, or any combination of simultaneous or sequential events on any combination of single or multiple channels. The desired pattern may begin on any of the acquisition channels 302-308, which eliminates the restrictions of the prior art systems.

Data reduction module 335 may be used to perform additional processing of coincidences, such as performing various statistical calculations, such as average time between events, maximum and minimum time between events, and the distribution of event durations. Alternatively, the data reduction module 335 may be eliminated, and the data reduction functions may be performed on host processor 102 (FIG. 1).

The predetermined pattern that determines if a series of events is to be considered a coincidence is stored in parameter memory 316. The device may be configured to detect one or more such signatures at the same time. In one embodiment, 15 signatures are detectable simultaneously. This information comprises a range, or multiple ranges of time bins and set of channels that have events. In one embodiment, the information is hard coded into FPGA 300 during synthesis, for a particular experiment. In another embodiment, the parameter memory 316 may be loaded via host processor 102 (see FIG. 1), to allow for increased flexibility. In this way, a variety of different patterns may be identified without the need to re-synthesize the FPGA.

Data storage 322 is used to store intermediate results, and record the number of coincidences that have been detected and/or timestamps when coincidences occurred, which is then reported to the host processor 102 (see FIG. 1). Clock input 320 is used to receive an external clock signal (see 213 of FIG. 2) from which an internal clock can be derived. This greatly reduces jitter by synchronizing the clock signal within FPGA 300 to a reliable external clock source, including one directly derived from exciter.

FIG. 4 is a block diagram illustrating details of the interface between the acquisition board 104 (see FIG. 1) and the host processor 102 (see FIG. 1), in accordance with an embodiment of the present invention. Acquisition board 104 comprises pulse signal processing module 440, which converts the output of a sensor, such as a single-photon avalanche photodiode (SPAD), to suitable voltage levels for input into the acquisition channels on board the FPGA 300. In this embodiment, data from the FPGA is then output to buffer communication controller 430, which handles transmitting and receiving data via communications bus 107 to the host processor 102. In one embodiment, communication controller 430 is a Cypress CY7C68013A (also referred to as FX2), and the FPGA 300 is an Altera Cyclone II, and communications bus 107 is a USB.

In another embodiment, the sensors used in the digital sensor array (110 of FIG. 1) have an output that is directly compatible with the voltage levels for the acquisition channels on board FPGA 300, thereby eliminating the need for pulse signal processing module 440 on acquisition board 104.

Signal processing module 440 comprises a comparator. A comparator is used to convert sensors digital output into a digital output compatible with an FPGA. In one embodiment, an FPGA requires a TTL compatible digital output with the high level greater than 1.5 V and low level less than 1.4 V.

In some embodiments, signal processing module 440 may further include a DSP (digital signal processor) which can be used to perform additional filtering or processing in the digital domain. This processing may include, but is not limited to, smoothing with running averages. In one embodiment, the DSP implements a digital filter that rejects all pulses that are shorter than a predetermined duration. In other embodiments, digital signal processing may be accomplished within an FPGA.

As stated previously, host processor 102 may be a PC running Windows, Linux, or other suitable operating system, and has one (or more) microprocessors executing computer instructions which are stored in a computer-readable medium, such as RAM, ROM, or magnetic or optical storage, to facilitate communication with the acquisition board 104, as well as provide for user control. In one embodiment, a software stack executing on the host processor 102 comprises a communications driver 432 which performs low-level reads and writes via communications bus 107. Middleware 434 comprises one or more software routines to exchange data with the communications driver 432, perform higher level calculations such as averaging, and other statistical processing, and exchange data with user interface 436, which provides display and or storage of the results.

FIG. 5 is a timeline 500 representing a plurality of single events (indicated generally as reference 504, and represented by an "x" symbol) that comprise a coincidence. A plurality of time bins (indicated generally as reference 502, and represented by a "$t_i$" symbol, where i is the number of the bin. Windows W1 and W2 can be used to specify a range of time bins that can be used for determining a coincidence of events. In the example shown, a user specified that if two events appear within window W1, and a subsequent event appears at some time later in window W2, then the coincidence has occurred. In this case, the relative window difference Dw is used as a parameter to define the coincidence that it is desired to detect. A user can specify a desired value for (not shown) by entering it into the host processor (102 of FIG. 1). The value for Dw is then stored in parameter memory (316 of FIG. 3) of FPGA 300. A number designation for a bin, i, can be controlled via a start channel: explicitly, when start channel output is "true" (high, logical 1), the time bin is zeroed.

FIG. 6 illustrates a pulse signal 602 which is the output of an analog sensor from analog sensor array 210 (FIG. 2). ADC board 214 comprises an analog-to-digital converter, as well as an optional DSP to perform various measurements and processing of the pulse signal 602. DSP functions can be delegated to an FPGA chip to reduce cost. Signal 602 represents voltage as a function of time. In one embodiment, a threshold voltage Th is established, and a duration D from the positive-sloped transition point Pt to the negative-sloped transition point Nt is computed. Pulses having a duration D shorter than a predetermined interval are rejected (FIG. 4). In another embodiment, the predetermined peak amplitude P, and/or predetermined integral area PA are also recorded, and may be used as criteria for further processing. Other embodiments also include pulse length and/or shape similarity result. Those parameters may be a function of the number of photons received. This may be the case when analog photon-number resolving sensors are used. Several of these parameters can be combined to define the coincidence signature of interest, for example a signature of just n photons detected with some fixed relationship to each other.

Note that while the embodiments described above involve electrical outputs of single-photon detectors, embodiments of the present invention can also be used for characterization of similar digital electrical signals from other sources, and for analog signals as well. Furthermore, although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A system for multi-channel acquisition, comprising:
    at least one host processor having at least one user interface, said host processor configured to accept user input to define signature events and user selected time intervals;
    more than two acquisition channels, each of said more than two acquisition channels configured to detect similar or dissimilar events defined by a user as said signature events;
    a user configurable processor comprising at least one field programmable gate array (FPGA) device to rapidly reconfigure sets of said acquisition channels from which input is received;
    the user configurable processor configured to correlate said signature events detected by each of said more than two acquisition channels to identify coincidences occurring within said user selected time intervals, each of said more than two acquisition channels configured to detect one or multiple signature events one after another or simultaneously without requiring a fixed delay to be added to any of said more than two acquisitions channels;
    wherein said user configurable processor further includes a processing component configured to identify said coincidences by
        identifying a plurality predetermined sequences of events within said coincidences,
        identifying a plurality predetermined time bins, and
        associating said one or more predetermined sequences of events within said coincidences with one or more of said plurality of time bins to identify overlapping subsets of signature events within two or more coincidences;

a memory component which stores data about coincidences and said signature events on which said coincidences are based and wherein the user configurable processor correlates said signature events to detect multiple types of coincidences with overlapping signature events that occur within said user defined time interval;

a multi-coincidence detector configured to identify a user defined subset of signature events from one or more coincidences and report the identification of said user defined subset of signature events to said host processor; and wherein each of said more than two acquisition channels further includes at least one trigger component operatively coupled with an internal clock configured using field programmable gate array circuitry.

2. The system of claim 1, further comprising includes a plurality of sensors comprising an analog sensor array, and the system further comprises an analog-to-digital convert, configured to digitize an output signal from each analog sensor within the analog sensor array and output a corresponding digital pulse signal to one of said more than two acquisition channels.

3. The system of claim 1, further comprising an external dock that outputs an external dock, signal to a dock input on the user configurable processor, and wherein the user configurable processor is configured to generate an internal dock signal based on the external dock signal of the external clock.

4. The system of claim 1, wherein the user configurable processor is configured to include a start channel to start a measurement cycle.

5. The system of claim 4, wherein said host processor is configured and disposed to provide input to the start channel.

6. The system of claim 4, wherein an internal counter is disposed within the user configurable processor, and configured to provide input to the start channel.

7. The system of claim 2, further comprising an analog filter configured to receive an output of the analog sensor array and to create a filtered signal, the analog filter further configured to provide the filtered signal as an input to the analog-to-digital converter.

8. The system of claim 7, wherein the analog filter is a bandpass filter.

9. The system of claim 1 further comprising a means for digital peak detection and waveform measurement.

10. The system of claim 1 which includes a comparator.

11. The system of claim 1, further comprising means for identifying a signature event has occurred based on a measurement selected from a group consisting of a predetermined threshold, a predetermined duration, a predetermined integral area and a correspondence to a predetermined waveform metric.

12. A method for multi-channel acquisition, comprising the steps of:
providing a host processor:
generating pulse signals each corresponding to one of a plurality of single events;
providing a user configurable processor with a plurality of acquisition channels, each channel configured to detect the pulse signals of one of the plurality of single events, one after another or simultaneously;
without requiring a fixed delay to be added to any of said plurality of acquisition channels, the user configurable processor includes at least one field programmable gate array (FPGA) device to rapidly reconfigure sets of said acquisition channels from which input is received generating time bins and assigning to the appropriate time bin each of the pulse signals corresponding to the plurality of single events detected on each of the acquisition channels;
generating a signal if a detected pattern of single events on one or more of the plurality of acquisition channels within said time bins coincides with a specified pattern of single events;
communicating between the host processor and the user configurable processor when a signal is generated if a detected pattern of single events on one or more of the plurality of acquisition channels coincides with a specified pattern of single events.

13. A system for multi-channel acquisition, comprising:
a host processor;
an exciter, configured and disposed to excite a physical system with electromagnetic energy, thereby causing the physical system to emit photons;
a plurality of sensors, each sensor configured to generate a pulse signal upon detection of a photon corresponding to a single event of the physical system;
a user configurable processor, the user configurable processor comprising:
a plurality of acquisition channels, each channel configured to detect the pulse signals from one of the plurality of sensors one after another or simultaneously without requiring a fixed delay to be added to any of said plurality of acquisition channels;
at least one field programmable gate array (FPGA) to rapidly reconfigure sets of said acquisition channels from which input is received; a time stamp module, the time stamp module configured to generate time bins and assign to the appropriate time bin each of the pulse signals corresponding to the plurality of single events on each of the acquisition channels;
a multi-coincidence detector, configured to generate a signal if a detected pattern of single events on the plurality of acquisition channels within said time bins coincides with a specified pattern of single events; a parameter memory configured to store data about coincidences and said specified pattern of single events; and
a communications bus configured to allow data communication between the host processor and the user configurable processor.

14. The system of claim 13, wherein the parameter memory is configured to be writable via the host processor.

15. The system of claim 14, the user configurable processor further comprises a data reduction module, the data reduction module configured to compute values for parameters selected from the group consisting of: average time between events, maximum time between events, and minimum time between events.

16. The system of claim 13, wherein the time stamp module is synchronized to an internally generated signal.

17. The system of claim 11, wherein the means for generating a pulse signal upon detecting that the output signal exceeds a predetermined integral area, comprises a digital signal processor.

* * * * *